United States Patent [19]

Schmitt

[11] Patent Number: 5,584,396
[45] Date of Patent: Dec. 17, 1996

[54] SLIDING PIVOTING STORAGE APPARATUS

[76] Inventor: Ty Schmitt, 2018 Red Oak Cir., Round Rock, Tex. 78681

[21] Appl. No.: 443,251

[22] Filed: May 17, 1995

[51] Int. Cl.⁶ .................................................. A47F 7/00
[52] U.S. Cl. .............................................. 211/26; 361/727
[58] Field of Search ...................... 211/26, 41; 361/683, 361/725, 726, 727, 829

[56] References Cited

U.S. PATENT DOCUMENTS

| | | | |
|---|---|---|---|
| 2,566,064 | 8/1951 | Keim | 361/726 X |
| 2,857,558 | 10/1958 | Fiske | 361/727 |
| 2,895,087 | 7/1959 | Lieb et al. | 361/727 X |
| 3,662,225 | 5/1972 | Carter et al. | 361/727 X |
| 4,660,125 | 4/1987 | Purdy et al. | 361/727 |
| 4,702,535 | 10/1987 | Beun | 361/727 X |
| 5,381,315 | 1/1994 | Hamaguchi et al. | 361/727 |

*Primary Examiner*—Kenneth J. Dorner
*Assistant Examiner*—Jerry Redman
*Attorney, Agent, or Firm*—Haynes and Boone, L.L.P.

[57] ABSTRACT

An equipment storage apparatus and system includes one or more housing units mounted to a supporting rack structure. The housing units include carrier units which are designed to hold component peripheral units of a centrally located storage system. The carrier units are operable to slide forwardly beyond the housing structure and then pivot to an open position from which access is made available to the rear portion of the carrier from the front of the housing thereby providing frontal access to the cables and connectors located at the rear portion of a peripheral unit.

21 Claims, 3 Drawing Sheets

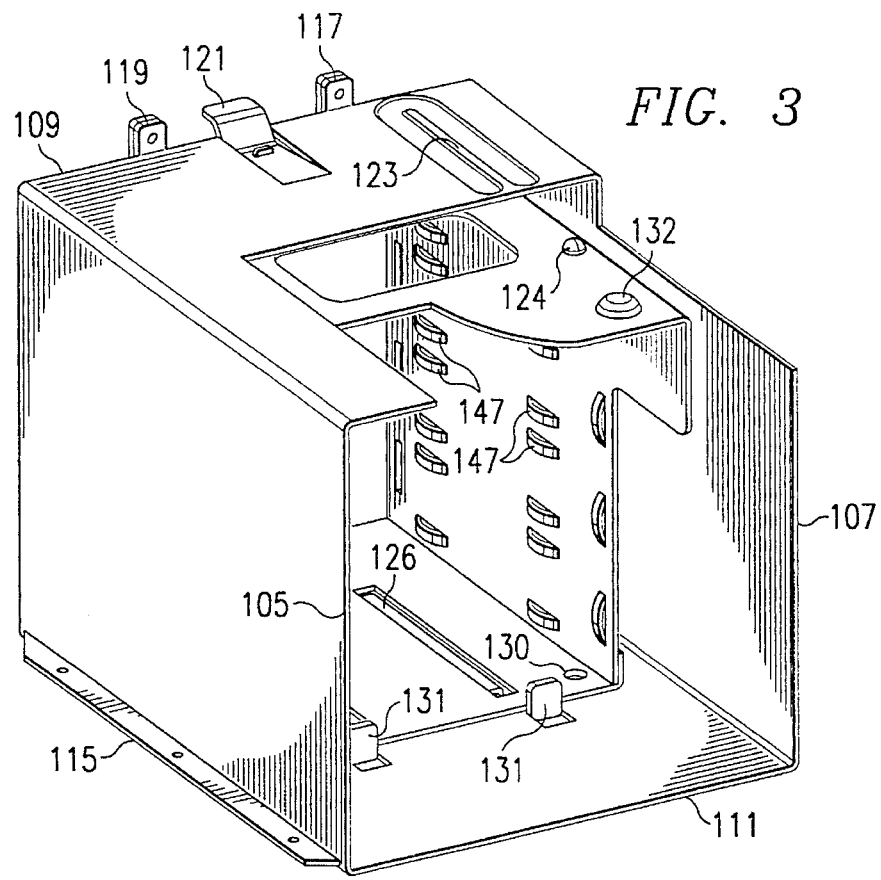
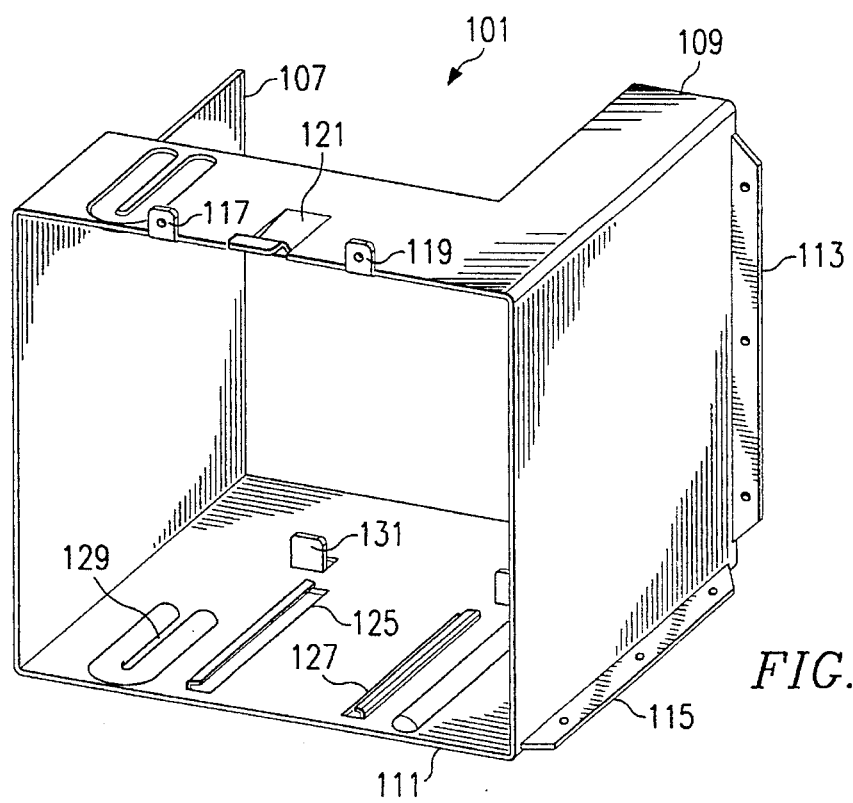

SLIDING PIVOTING STORAGE APPARATUS

FIELD OF THE INVENTION

The present invention relates generally to shelving systems and more particularly to a storage apparatus for storing components of centralized electronic systems.

BACKGROUND OF THE INVENTION

In the past, maintenance and upgrading of electrical equipment stored in rack mountable systems in a central location has been extremely difficult because of the mounting arrangement and limited space available for the equipment. In many applications, including, for example, an arrangement for storing the various components of a computer server central station, the various components or subsystems and/or peripheral devices of the system are stored in a limited space area, in shelving units, to serve a larger area which includes individual desktop stations. While the desktop units are relatively accessible from the rear of the units to maintain or upgrade or troubleshoot the desktop unit, the same accessibility is usually not available with regard to the shelving of the system server and its components. The larger systems are relatively heavy and cumbersome and their mounting and shelving arrangements are therefore relatively stationary and bulky. When it is necessary to gain access to equipment components mounted in a shelving structure containing the server computer and its peripherals, it has been necessary in the past to do considerable disassembly of the component enclosures in order to access the back end of the system components. Server external drive peripheral connections and cables are located at the rear of such external drives, i.e. for tape, CD and floppy drives. This makes access to them, even after the cover is removed, difficult in most cases due to the presence of power supplies, boards, other external drives, and other various sheet metal and other plastic parts. The user is, in some cases, faced with having to make blind connections and in most cases, must navigate their hand through narrow sheetmetal openings.

Thus, there is a need for an improved shelving system and apparatus for housing computer server system components and peripherals which allows relatively easy and fast access to the connections in the rear of the shelved units for maintenance, upgrading and other purposes.

SUMMARY OF THE INVENTION

It is therefore an object of the present invention to provide an improved shelving system which is capable of housing items to be stored in a limited centralized area and also providing quick and easy access to such items when necessary.

In accordance with the present invention there is provided a storage apparatus for shelving items to be stored, having a housing structure which includes a mounting device operable for mounting the housing structure to a self-supported rack structure thereby securing the housing structure to the rack structure, the housing structure having a front section and a back section, and a carrier device operatively coupled to the housing structure, the carrier device having a front section and a back section and being arranged to store at least one of the items to be stored in a storage position relative to the housing structure, the back section of the carrier device being positioned at the back section of the carrier housing structure in the storage position, with the carrier device being selectively movable within said housing structure to move the back section of the carrier device to the front section of the housing structure in an access position, whereby the stored items in the carrier device are accessible from the front section of the housing structure.

BRIEF DESCRIPTION OF THE DRAWINGS

A better understanding of the present invention can be obtained when the following detailed description of the preferred embodiment is considered in conjunction with the following drawings, in which:

FIG. 3 is a rear perspective view of the apparatus shown in FIG. 2;

FIG. 4 shows an enlarged view of the carrier housing structure shown in FIGS. 1–3;

DETAILED DESCRIPTION

Although the present invention will be explained in connection with the preferred embodiment as applicable to a computer system, it will be understood that the principles of the present invention are equally applicable to any shelving system where it is desirable to mount peripheral units or components of the system in one central area having limited space, and still provide access to the rear portion of the individually mounted components for electrical connections, adjustments, maintenance, or for many other reasons.

In accordance with the preferred embodiment of the present invention, access is allowed to the rear of the external peripheral devices by making the bay that the external drives are assembled in, free to move in a controlled manner once any retention features are removed. In the disclosed design, the housing bay is pulled out to a fixed pivot point and then stopped. The bay may then be rotated inwardly toward the center of the rack so that the connectors located at the rear of the drives or other system components are easily accessed. Cable retention and guide features can also be placed in the sheet metal housing or be made by standard plastic clips snapped into the sheetmetal. These cable guides will help prevent the cables from being pinched or cut during movement of the housing bay. The bay itself can be retained by screws or by features in the CPU bezel that locate and push against the bay once the bay is snapped into position. The use of either of the above options depends on the design of the server CPU box. Formed guides are also located in the bay and chassis to supply added strength against transverse forces imposed mostly by shock and vibration.

In FIGS. 1 through 6, like numerals refer to like parts although not all of the like parts are numbered in all of the drawings in order to more clearly show all of the featured parts and mechanical characteristics of those parts as implemented in the exemplary embodiment of the present invention as disclosed herein.

Figure 1:
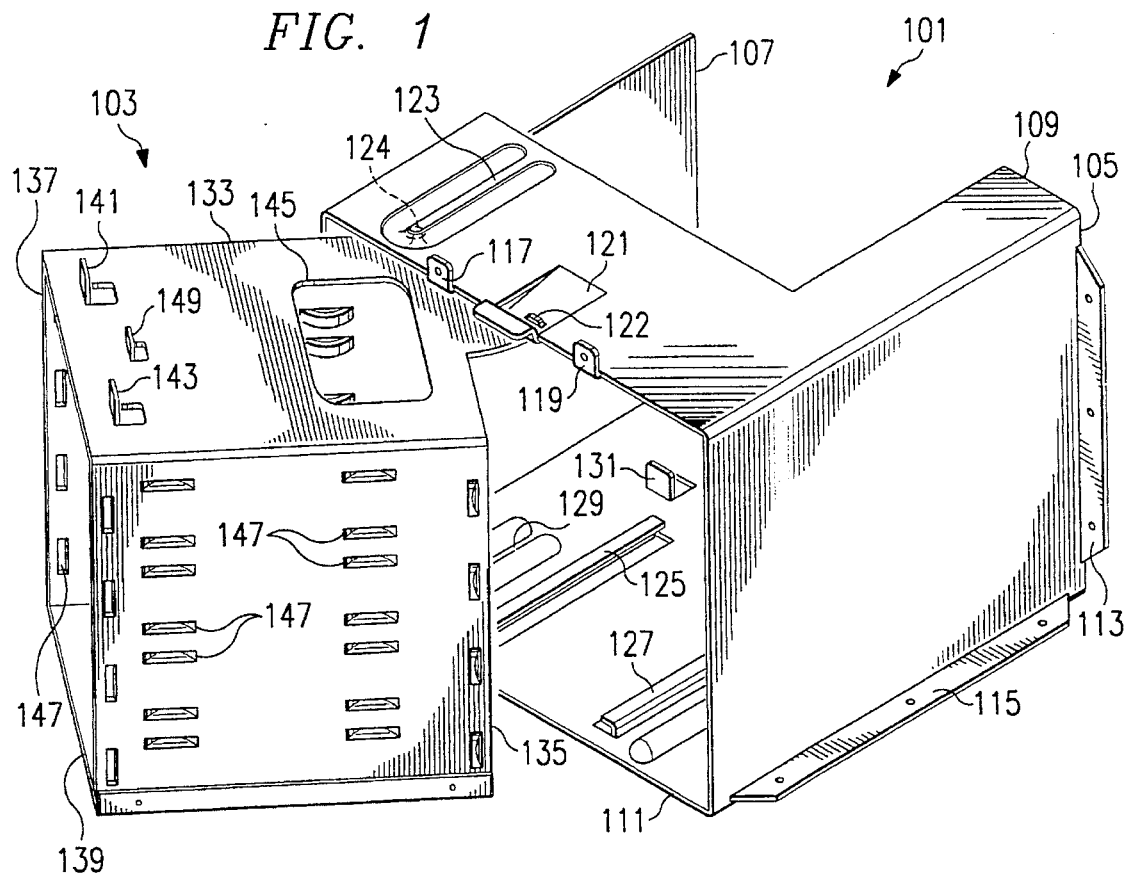
FIG. 1 is a perspective illustration showing the housing and peripheral carrier device of an exemplary embodiment of the present invention, shown in an "open" position.

Referring now to FIG. 1 in detail, there is shown a carrier housing structure 101 in which a carrier device 103 is arranged to move. As illustrated in FIG. 1, the storage apparatus including the housing 101 and the carrier 103 are shown in an "open" or "access" position. The carrier 103 is designed to carry a computer peripheral device in the present example, such as a tape drive. The tape drive is not shown in order to more clearly illustrate the advantages of the present invention. The tape drive or other peripheral device can be mounted within the carrier 103 such that the electrical connections at a connector interface in the back or rear portion of the device would be accessible from the back or rear section of the carrier 103. As shown in FIG. 1, the housing 101 includes side walls 105 and 107 as well as a top surface 109 and a bottom surface 111. In the present example, the housing 101 and carrier 103 are constructed of sheet metal for strength although other suitable materials could also be used.

The housing 101 also contains mounting brackets including a back mounting bracket 113 at the back or rear of the housing 101 and a side mounting bracket 115 along the side of the housing 101. The mounting brackets 113 and 115 are arranged to allow the housing 101 to be mounted on an equipment rack in a shelf-like manner, along with other peripheral components mounted in similar housings on a common rack which would also house the CPU unit of a server computer system for example. When properly mounted, the mounting brackets 113 and 115 would be secured, by screws for example, to a system rack and would not be movable relative to the rack. The mounting bracket 113 is located at the rear of the housing 101 and would normally be placed against or adjacent to a wall in the limited space environment of an equipment room. In that position, it would normally be extremely difficult to gain access to the electrical connections of a peripheral unit placed in the housing 101 which has its electrical connections accessible only from the rear of the housing 101 near the end of the housing which is nearest the back bracket 113. However, as is hereinafter explained, when the peripheral device or component is mounted within the carrier 103, access is easily attained from the front of the housing 101 making maintenance and upgrading chores associated with the peripheral component exceptionally easy.

The housing 101 also includes first and second mechanical stops 117 and 119 as well as a selectively releasable latching device 121 arranged at the front end of the housing 101 on the top surface 109. Also on the top surface 109 is a guide mechanism including a slot 123 embossed therein. On the bottom surface 111 of the housing 101 is shown another guide slot 129 which is aligned below the top surface slot 123. FIG. 1 also shows a carrier guide device which includes guide channels 125 and 127, as well as another mechanical stop 131, all arranged within the bottom surface 111 of the housing 101.

Figure 2:
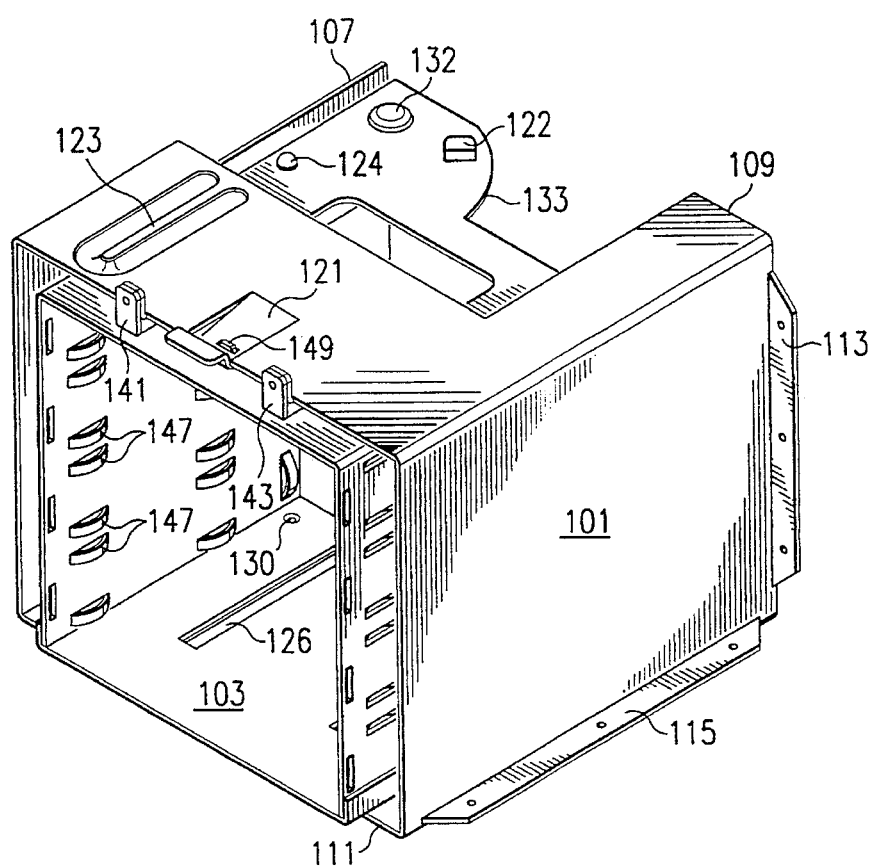
FIG. 2 shows the FIG. 1 housing and carrier shown in a "closed" position.

The carrier unit 103 includes a top surface 133 and a bottom surface 139 as well as side walls 135 and 137. The top surface 133 of the carrier 103 includes a pair of mechanical stops 141 and 143 at the front end of the carrier 103 which line-up to and correspond with the mechanical stops 117 and 119, respectively, on the front of the housing unit 101 when the apparatus is in the "closed" as shown in FIG. 2. The mechanical housing stops 117, and 119 and also the carrier stops 141 and 143 are designed in the present example to be selectively connected together, for example by screws, during normal system operation, but selectively detachable in order to allow the carrier to slide outwardly and yield access to the cables at the rear of a mounted peripheral device placed in the carrier 103. The top surface 133 of the carrier also defines an opening 145 which is designed to allow improved air circulation and minimize the weight of the carrier 103. The carrier 103 also includes alignment spacers 147 located on the outside walls of the carrier to provide alignment of the carrier 103 within the housing 101 as well as making the carrier more secure and stable relative to the housing 101 and also the peripheral component mounted within the carrier 103.

FIG. 2 shows the carrier 103 within the housing 101 in a "closed" or "storage" position. As shown in FIG. 2, this would be the normal position of the carrier 103 when the system is "on-line" and in operation, while the "open position" shown in FIG. 1 would be used when the peripheral device within the carrier 103 is being serviced and access to the rear or cable connection end of the peripheral device is required. In FIG. 2, a carrier guide means includes carrier channels 126 and 128 which are illustrated in the present example as part of the bottom surface of the carrier 103. The channel 126 and 128 on the carrier 103 are designed to match with the corresponding channels 125 and 127 in the bottom surface 111 of the housing 101, and together, all of the channels shown comprise a guide device for guiding the movement of the carrier 103 within the housing 101. The guide device including the channel arrangements shown may also be implemented in other arrangements such as tracking arrangements or tongue and groove, in order to provide a guide in the housing 101 upon which the carrier 103 may move into and out of the closed position. The guide structure, in any form, need not be constructed on the bottom face of the carrier 103 or the housing 101 but may be positioned elsewhere in the apparatus to provide the disclosed guide function.

Also shown in FIG. 2 is a limit stop 122 which is effective to limit the rotational movement of the carrier 103 and engage with the locking clip 121 on the housing 101. A pivoting slide carrier boss 124 is located on the top surface 133 of the carrier 103 and is designed to engage with the slot 123 to comprise a slide and pivot mechanism to guide the carrier 103 movement outwardly from the closed position and also to enable a pivoting movement of the carrier 103 when it is fully extended forwardly from the housing 101 as shown in FIG. 1. Together, boss 124 and the guide slot 123 comprise a control mechanism which provides several functions i.e. to allow a sliding movement, to guide the carrier during the movement, and also to enable rotational movement of the carrier 103. As can see seen in FIG. 1, at the extended or open position of the carrier 103, the boss 124 which is engaged with the guide slot 123 beneath the top surface 109 of the housing 101, represents and defines a pivot point about which the carrier 103 is able to rotate. The axis of the carrier rotation includes that pivot point and extends vertically near the front edge of the housing 101. The pivot point and axis of carrier rotation needs to be as near as possible toward the front end of the housing to insure that the carrier can rotate outwardly and clear the housing 101. The bottom surface 139 of the carrier 103 also includes, in the present example, a second pivoting slide carrier boss 130 which is arranged to engage with the corresponding guide slot 129 on the bottom surface 111 of the housing 101.

FIG. 3 is a perspective view of the housing 101 and carrier 103 in the closed position as viewed from the rear of the housing 101. FIG. 3 illustrates more clearly the mechanical stops 131 on the bottom surface 111 of the housing 101 and how they are effective to limit the rearward movement of the carrier 103 in order to maintain alignment of any peripheral unit mounted thereon. As can be seen in FIG. 3, the entire rear portion of the housing 101 and carrier 103 is open to receive connectors and cables attaching to a device within the carrier 103. The spacer guides 147 are also shown more clearly and their function to align and hold a carrier-mounted peripheral device can be better observed.

In FIG. 4, a better view of the channel guides 125 and 127 in the bottom surface 111 of the housing 101, as well as the lower guide slot 129, is presented.

Figure 5:
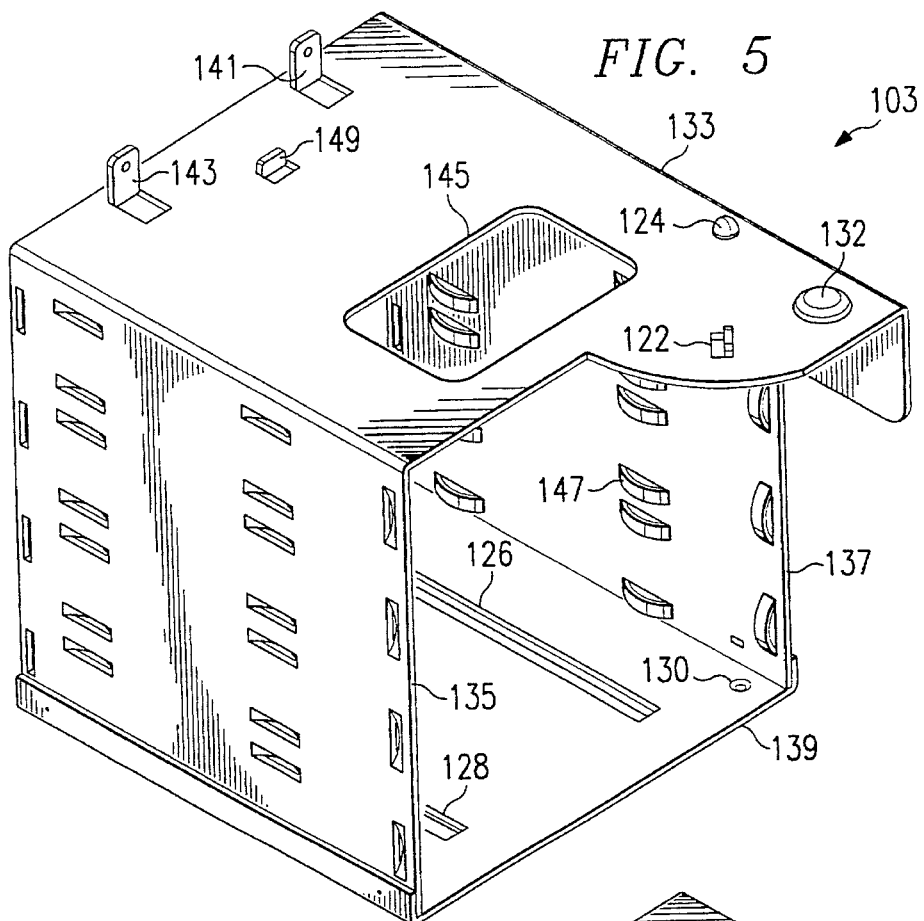
FIG. 5 shows an enlarged rear perspective view of the carrier device.
Figure 6:
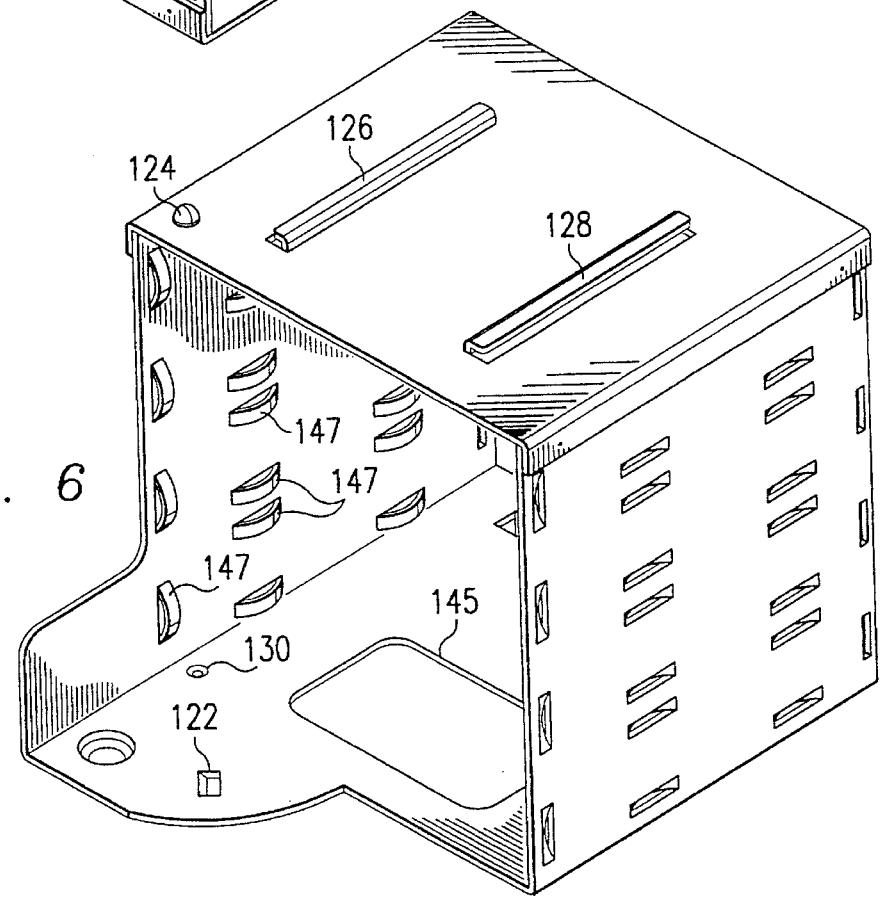
FIG. 6 is another perspective view of the carrier shown in FIG. 5.

FIGS. 5 and 6 show enlarged views of the carrier 103 from different perspectives. FIG. 5 also shows a counter-balancing slide-spacer button 132 which is implemented in the present example to maintain proper spacing between the carrier 103 and the housing 101, and to slide along the underside of the top surface 109 of the housing 101 when the carrier 103 is extended from the housing 101. The button 132 acts to help offset the tendency of the carrier 103 to tilt forwardly when fully extended.

In operation, referring first to FIG. 1, the carrier 103 is sized and configured to enclose and support a peripheral tape drive, for example, which is a component of a server-terminal computer system, where the server and all of its peripheral components are mounted in a rack type shelving arrangement which is centrally located within the area supported by the system. The carrier 103 is slidably engaged within the housing 101, and the housing 101 is mounted to the system rack mounted support structure as is well known in the art.

The carrier 103 and housing 101 are shown in FIG. 2 in the "closed" position wherein the carrier 103 fits snugly within the housing 101 and is maintained in position by means of the stops 141 and 143 being engaged with the corresponding stops 117 and 119. The housing 101 also holds the carrier 103 in place by means of the spring biased clip lock 121 engaging with the tab 149 on the top surface 133 of the carrier 103. The spacer guides 147 are arranged to hold the mounted peripheral unit relatively firmly within the carrier 103. The position shown in FIG. 2 is the normal operating position which effectively stores a mounted peripheral unit within the carrier 103 during normal operation of the server system.

When it is desirable or necessary to maintain or upgrade the peripheral unit that may be mounted within the carrier 103, a user is able to release the spring clip 121 and also the screws holding the stop tabs 141, 143, 117 and 119 together, respectively. The carrier 103 is then free to slide forwardly from the housing 101 to an extended position where the carrier boss 124 is engaged within the guide slot 123, and the carrier boss 130 is engaged within the lower guide slot 129, at the forward end of the housing 101. At that point, the carrier 103 is able to rotate around the central axis of the carrier bosses 124 and 130 to an "open" position as shown more clearly in FIG. 1. The "U" shaped channel design of the guide slot 123 allows the carrier 103 to be opened to a greater degree than normal after full extension of the carrier 103. In the "open" position, there is provided ample access to the rear portion of the carrier 103 where the connectors and cables to the carried peripheral unit are located. Thus the peripheral units mounted within the carriers designed in accordance with the present invention may be easily disconnected and removed for upgrading or maintenance or even replacement. After servicing, the peripheral unit may be restored to the carrier 103, where it is reconnected and easily slid back into its operating position as shown in FIG. 2.

The apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as defined by the following claims.

I claim:

1. A storage apparatus for use in a computer system comprising:

a housing structure said housing structure having a front section and a back section;

a carrier device operatively coupled to said housing structure, said carrier device having a front section and a back section, the back section of said carrier device begin positioned at the back section of said housing structure in a storage position, said carrier device being selectively movable within said housing structure to move the back section of said carrier device to the front section of said housing structure in an access position, whereby the back section of said carrier device is accessible from the front section of the housing structure;

a boss on the carrier device; and an elongated boss guide slot on the housing structure, the slot having an open end and a closed end, the open end slidably receiving the boss in response to the carrier device being moved from the storage position to the access position, the closed end pivotally retaining the boss and permitting a substantial portion of the back section of the carrier device to move to a pivot position away from the front section of the housing.

2. The invention as set forth in claim 1 wherein said carrier device is selectively movable in a linear direction from said storage position to said access position.

3. The invention as set forth in claim 1 wherein said carrier device pivots about a pivoting axis, said pivoting axis extending through the boss and being located near the front section of said housing structure.

4. The invention as set forth in claim 3 wherein said pivoting axis is vertically oriented.

5. The invention as set forth in claim 1 wherein said storage apparatus further includes limit means operatively coupled to said housing structure to limit movement of said carrier device within said housing structure.

6. The invention as set forth in claim 5 wherein said limit means is operable to limit rearward movement of said carrier device to said storage position.

7. The invention as set forth in claim 5 wherein said limit means comprises a first limit tab structure positioned on said housing structure, said limit means further including a second limit tab structure positioned on said carrier device, said first and second limit tab structures being arranged to come in contact in said storage position to prevent further rearward movement of said carrier device within said housing structure.

8. The invention as set forth in claim 7 wherein said first and second tab structures are constructed to be selectively attached together at said storage position.

9. The invention as set forth in claim 1 wherein said storage apparatus includes a selectively operable two position locking device.

10. The invention as set forth in claim 9 wherein said selectively operable locking device is operable to lock said carrier device in said storage position and in said pivot position.

11. A storage apparatus for use in a computer system comprising:

a housing structure, said housing structure having a front section and a back section;

a carrier device operatively coupled to said housing structure, said carrier device having a front section and a back section, the back section of said carrier device being positioned at the back section of said housing structure in a storage position, said carrier device being selectively movable within said housing structure to move the back section of said carrier device to the front section of said housing structure in an access position, whereby the back section of said carrier device is accessible from the front section of the housing structure;

carrier guide channels on the carrier device;

housing guide channels on the housing structure slidably engaged with the carrier guide channels;

a boss on the carrier device; and an elongated boss guide slot on the housing structure, the slot having an open end and a closed end, the open end slidably receiving the boss in response to the carrier device being moved from the storage position to the access position, the closed end pivotally retaining the boss and permitting the housing and guide channels to disengage and permitting a substantial portion of the back side of the carrier device to move to a pivot position away from the front slide of the housing.

12. The invention as set forth in claim 11 wherein said carrier device is selectively movable in a linear direction from said storage position to said access position.

13. The invention as set forth in claim 11 wherein said carrier device pivots about a pivoting axis, said pivoting axis extending through said boss and being located near the front section of said housing structure.

14. The invention as set forth in claim 13 wherein said pivoting axis is vertically oriented.

15. The invention as set forth in claim 11 wherein said storage apparatus further includes limit means operatively coupled to said housing structure to limit movement of said carrier device within said housing structure.

16. The invention as set forth in claim 15 wherein said limit means is operable to limit rearward movement of said carrier device to said storage position.

17. The invention as set forth in claim 15 wherein said limit means comprises a first limit tab structure positioned on said housing structure, said limit means further including a second limit tab structure positioned on said carrier device, said first and second limit tab structures being arranged to come in contact in said storage position to prevent further rearward movement of said carrier device within said housing structure.

18. The invention as set forth in claim 17 wherein said first and second tab structures are constructed to be selectively attached together at said storage position.

19. The invention as set forth in claim 11 wherein said storage apparatus includes a selectively operable two position locking device.

20. The invention as set forth in claim 19 wherein said selectively operable locking device is operable to lock said carrier device in said storage position and in said pivot position.

21. The invention as set forth in claim 11 further comprising a plurality of bosses on the carrier device provided for engagement with a respective plurality of boss guide slots on the housing structure.

* * * * *

UNITED STATES PATENT AND TRADEMARK OFFICE
CERTIFICATE OF CORRECTION

PATENT NO. : 5,584,396
DATED : December 17, 1996
INVENTOR(S) : Ty Schmitt

It is certified that error appears in the above-identified patent and that said Letters Patent is hereby corrected as shown below:

On title page,

Add the Assignee name of Dell USA, L.P.

Signed and Sealed this

Twenty-fourth Day of March, 1998

Attest:

BRUCE LEHMAN

Attesting Officer

Commissioner of Patents and Trademarks